(12) United States Patent
Kim

(10) Patent No.: US 12,556,037 B2
(45) Date of Patent: Feb. 17, 2026

(54) ANTENNA STRUCTURE SUPPORTING WIRELESS CHARGING AND ELECTRONIC DEVICE HAVING THE SAME

(71) Applicant: SAMSUNG ELECTRONICS CO., LTD., Suwon-si (KR)

(72) Inventor: Dohyeon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 843 days.

(21) Appl. No.: 17/745,238

(22) Filed: May 16, 2022

(65) Prior Publication Data

US 2023/0022349 A1    Jan. 26, 2023

Related U.S. Application Data

(63) Continuation of application No. PCT/KR2022/005540, filed on Apr. 18, 2022.

(30) Foreign Application Priority Data

Jul. 26, 2021 (KR) .................. 10-2021-0097657
Nov. 19, 2021 (KR) .................. 10-2021-0160617

(51) Int. Cl.
*H02J 50/10* (2016.01)
*H01F 27/28* (2006.01)
(Continued)

(52) U.S. Cl.
CPC .......... *H02J 50/10* (2016.02); *H01F 27/2804* (2013.01); *H01F 27/288* (2013.01); *H05K 1/0277* (2013.01); *H05K 1/165* (2013.01)

(58) Field of Classification Search
USPC .................. 320/106, 107, 108, 109, 110
See application file for complete search history.

(56) References Cited

U.S. PATENT DOCUMENTS 10,469,133 B2    11/2019   Ahn et al.
2014/0266030 A1   9/2014   Park et al.
(Continued)

FOREIGN PATENT DOCUMENTS

| CN | 110913674 A | * | 3/2020 | ............... B32B 7/12 |
| CN | 112787416 A | | 5/2021 | |

(Continued)

OTHER PUBLICATIONS

International Search Report (PCT/ISA/210) and Written Opinion (PCT/ISA/237) dated Aug. 1, 2022 issued by the International Searching Authority in International Application No. PCT/KR2022/005540.

(Continued)

*Primary Examiner* — Brian Ngo
(74) *Attorney, Agent, or Firm* — Sughrue Mion, PLLC

(57) ABSTRACT

Provided is an antenna structure configured to wirelessly charge, the antenna structure including an insulating substrate, a coil formed on a first surface of the insulating substrate in a winding structure, the coil being wound a certain number of times in a clockwise and/or a counter-clockwise direction around an axis normal to the insulating substrate, a coating layer including a first magnetic material, the coating layer being disposed adjacent to and surrounding the coil in a winding structure corresponding to the winding structure of the coil, and a shielding sheet including a second magnetic material and facing the second surface of the insulating substrate.

18 Claims, 10 Drawing Sheets

(51) Int. Cl.
*H05K 1/02* (2006.01)
*H05K 1/16* (2006.01)

(56) References Cited

U.S. PATENT DOCUMENTS

| | | |
|---|---|---|
| 2015/0123604 A1 | 5/2015 | Lee et al. |
| 2017/0047791 A1 | 2/2017 | Jang et al. |
| 2018/0204672 A1 | 7/2018 | Mendoza Aguirre |
| 2020/0090858 A1 | 3/2020 | Hong et al. |
| 2020/0123657 A1 | 4/2020 | Fuss |
| 2020/0381178 A1 | 12/2020 | Kweon et al. |

FOREIGN PATENT DOCUMENTS

| | | | | |
|---|---|---|---|---|
| JP | 2012-134250 A | | 7/2012 | |
| JP | 2012235079 A | * | 11/2012 | ........... H01F 27/027 |
| JP | 2019-9177 A | | 1/2019 | |
| JP | 2019164941 A | * | 9/2019 | |
| JP | 2020-526917 A | | 8/2020 | |
| JP | 2021-034707 A | | 3/2021 | |
| JP | 2021-68815 A | | 4/2021 | |
| KR | 10-2013-0072181 A | | 7/2013 | |
| KR | 10-2016-0097171 A | | 8/2016 | |
| KR | 10-2017-0019826 A | | 2/2017 | |
| KR | 10-2017-0032861 A | | 3/2017 | |
| KR | 10-2017-0090938 A | | 8/2017 | |
| KR | 10-2017-0142769 A | | 12/2017 | |
| KR | 10-2018-0017687 A | | 2/2018 | |
| KR | 10-2018-0097064 A | | 8/2018 | |
| KR | 10-2020-0136664 A | | 12/2020 | |

OTHER PUBLICATIONS

Communication issued Jul. 31, 2024 by the European Patent Office in European Patent Application No. 22849668.3.

* cited by examiner

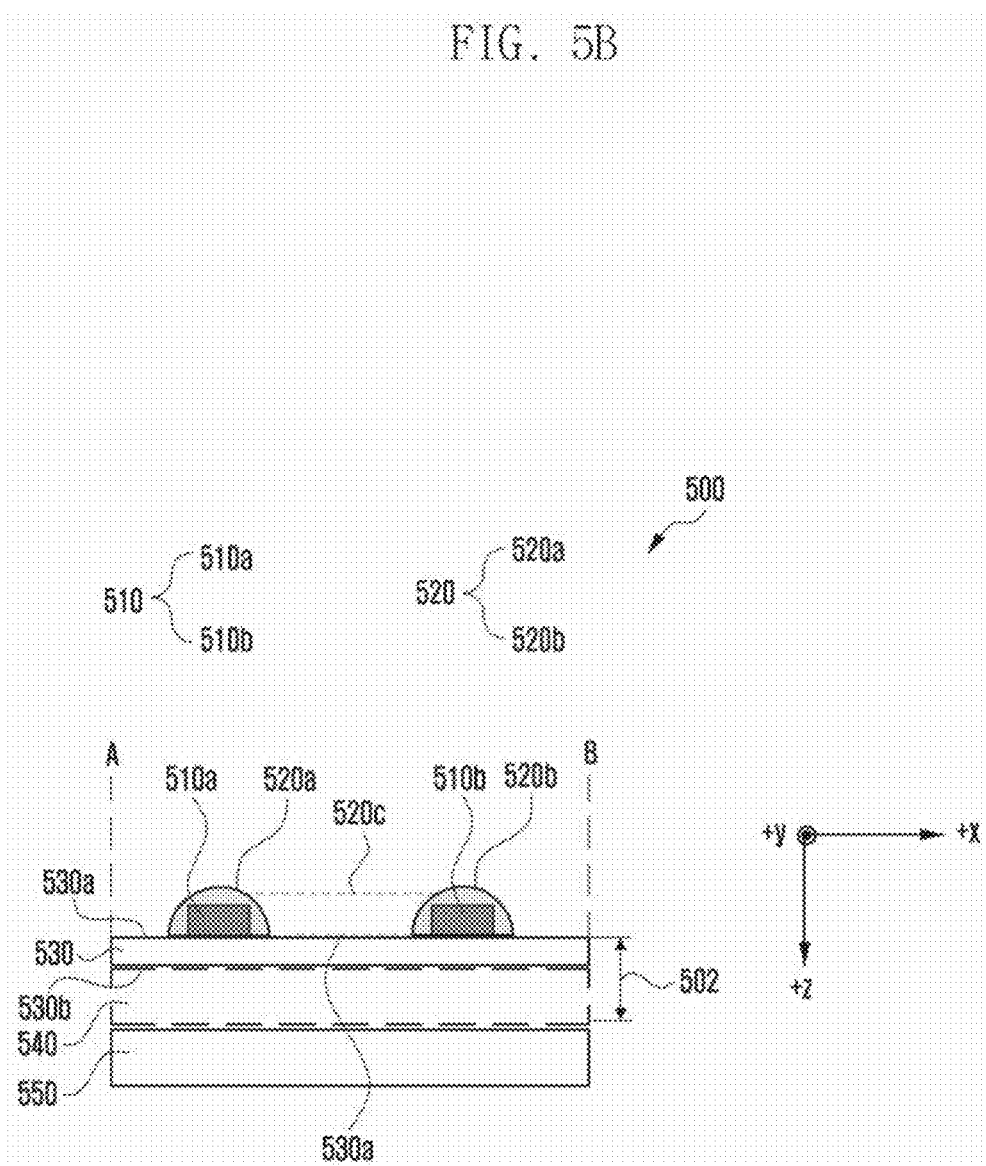

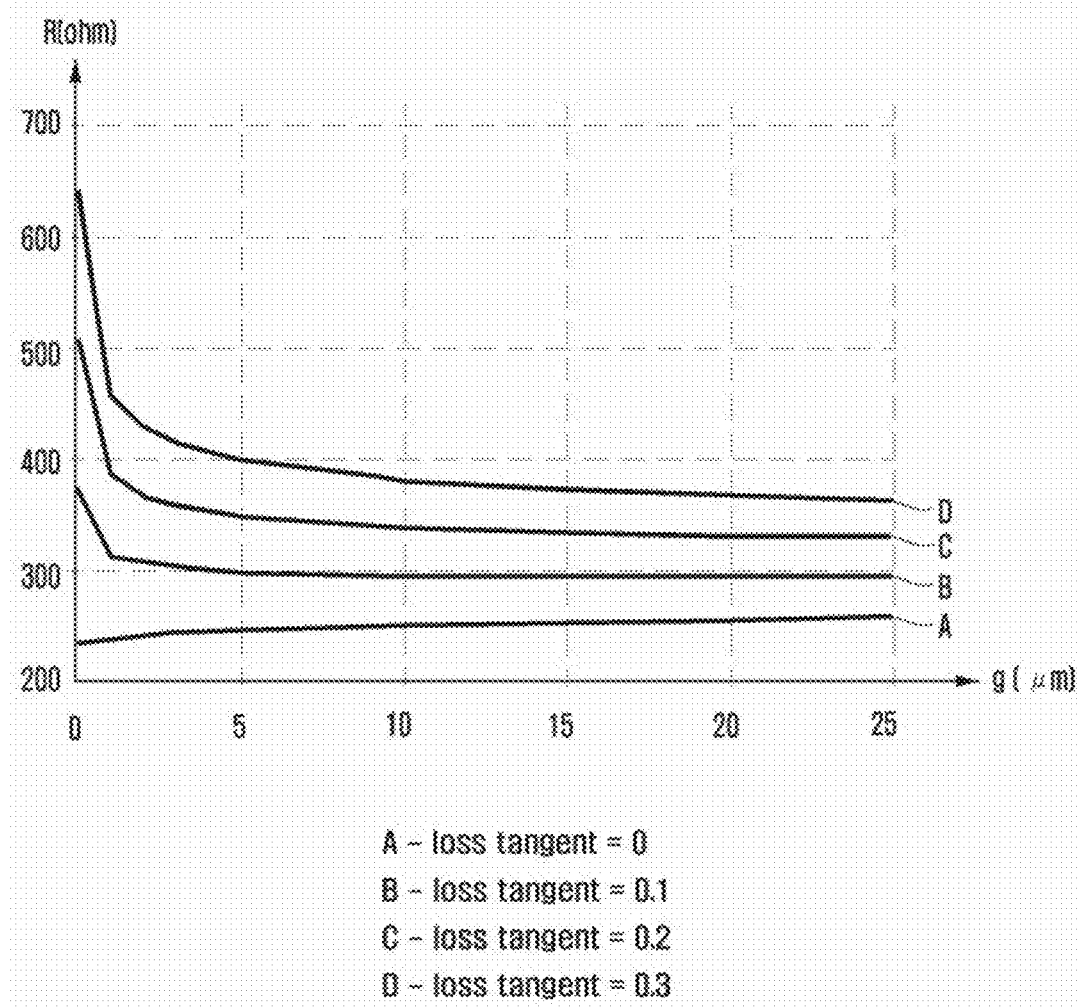

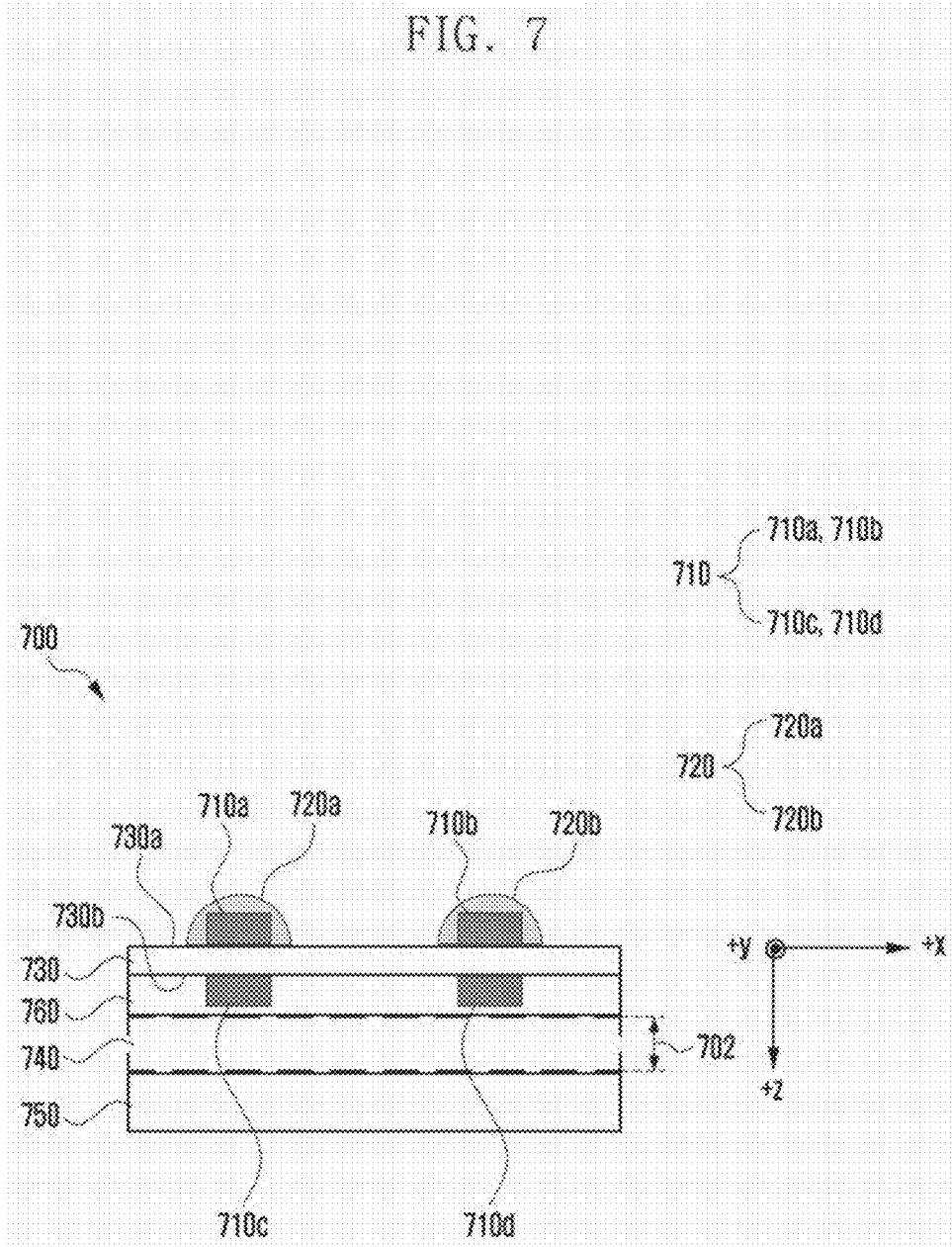

ANTENNA STRUCTURE SUPPORTING WIRELESS CHARGING AND ELECTRONIC DEVICE HAVING THE SAME

CROSS-REFERENCE TO RELATED APPLICATIONS

This application is a continuation application, claiming priority under § 365(c), of an International application No. PCT/KR2022/005540, filed on Apr. 18, 2022, which is based on and claims the benefit of a Korean patent application number 10-2021-0097657, filed on Jul. 26, 2021, in the Korean Intellectual Property Office, and of a Korean patent application number 10-2021-0160617, filed on Nov. 19, 2021, in the Korean Intellectual Property Office, the disclosure of each of which is incorporated by reference herein in its entirety.

FIELD

Various embodiments relate to an antenna structure for increasing the efficiency of wireless charging, and an electronic device having the same.

BACKGROUND

An electronic device may have an antenna structure for wirelessly sharing power with an external device. For example, the electronic device may receive power signals from the external device through a coil of the antenna structure, and may charge a battery by using the received power signals. In addition, the electronic device may transmit power from the battery to the external device through the coil.

An antenna structure may include a coil wound multiple times around an axis parallel to a first direction, and a magnetic material for directing a magnetic flux generated by the coil in the first direction. For example, when facing a cover (for example, rear cover) of an electronic device, the antenna structure may be disposed below the cover and may discharge a magnetic flux in the first direction in which the cover faces (that is, out of the cover).

The antenna structure may have a magnetic material disposed to be inserted between patterns of the coil. However, inserting the magnetic material between patterns may be a substantially difficult and complicated process. This may increase the antenna structure manufacturing cost.

The magnetic material may include a first magnetic material surrounding a part of the coil, and a second magnetic material disposed below the coil. The second magnetic material may direct a magnetic flux in the first direction, and may also shield another magnetic flux generated in the coil by components of the electronic device disposed below the same. As such, the second magnetic material may be referred to as a shielding sheet. In order to discharge magnetic fluxes out of the cover, the first magnetic material should not fully cover the coil. A process for preventing such full covering may also be difficult and complicated.

SUMMARY

Various embodiments of the disclosure may provide an antenna structure which can be manufactured with little costs and through simple processes, and which can increase wireless charging efficiency, and a portable electronic device having the same.

Technical problems to be solved by the disclosure are not limited to the above-mentioned technical problems, and other technical problems not mentioned herein will be clearly understood from the following description by those skilled in the art to which the disclosure pertains.

According to an aspect of an example embodiment, there is provided an antenna structure configured to wirelessly charge, the antenna structure including an insulating substrate, a coil formed on a first surface of the insulating substrate in a winding structure, the coil being wound a certain number of times in a clockwise and/or a counterclockwise direction around an axis normal to the insulating substrate, a coating layer including a first magnetic material, the coating layer being disposed adjacent to and surrounding the coil in a winding structure corresponding to the winding structure of the coil, and a shielding sheet including a second magnetic material and facing the second surface of the insulating substrate.

The antenna structure may further include a spacer configured to space the shielding sheet apart from the coil by a critical distance or more to reduce a magnetic flux generated in the coil and leaked to the coating layer through the shielding sheet.

The critical distance may be obtained based on an inherent energy loss characteristic of the first magnetic material included in the coating layer.

The insulating substrate, the coil, and the coating layer may be disposed on a flexible printed circuit board (FPCB).

The first magnetic material included in the coating layer may include iron or nickel, and the second magnetic material included in the shielding sheet may include a nanocrystal.

The first magnetic material included in the coating layer may be a conductive material or a non-conductive material, the conductive material may include at least one of iron, nickel, cobalt, or an alloy thereof, and the non-conductive material may include at least one of polymer or ceramic ferrite.

According to another aspect of an example embodiment, there is provided a portable electronic device including a front surface cover forming a front surface of the portable electronic device, a rear surface cover forming a rear surface of the portable electronic device, a display disposed between the front surface cover and the rear surface cover, and visually exposed through the front surface, a battery disposed between the display and the rear surface cover, and an antenna structure disposed between the battery and the rear surface cover, and configured to charge the battery, wherein the antenna structure may include an insulating substrate, a coil disposed on a first surface of the insulating substrate in a winding structure, the coil being wound a certain number of times in a clockwise and/or a counterclockwise direction around an axis normal to the insulating substrate, the first surface facing the rear surface cover, a coating layer including a first magnetic material, the coating layer being disposed adjacent to and surrounding the coil in a winding structure corresponding to the winding structure of the coil, and a shielding sheet including a second magnetic material and disposed between the battery and the insulating substrate.

The antenna structure may further include a spacer configured to space the shielding sheet apart from the coil by a critical distance or more to reduce a magnetic flux generated in the coil and leaked to the coating layer through the shielding sheet.

The critical distance may be obtained based on an energy loss characteristic of the first magnetic material included in the coating layer.

The insulating substrate, the coil, and the coating layer may be disposed on a flexible printed circuit board (FPCB).

The first magnetic material included in the coating layer may include at least one of iron or nickel, and the second magnetic material included in the shielding sheet may include a nanocrystal.

The first magnetic material included in the coating layer may be a conductive material or a non-conductive material, the conductive material my include at least one of iron, nickel, cobalt, or an alloy, and the non-conductive material may include at least one of polymer or ceramic ferrite.

According to another aspect of an example embodiment, there is provided an antenna structure configured to wirelessly charge, the antenna structure including an insulating substrate, a shielding sheet including a first magnetic material, a coil disposed on the insulating substrate in a winding structure, the coil being wound multiple times in a clockwise and/or a counterclockwise direction around an axis normal to the insulating substrate, and including a coil upper layer part disposed on a first surface of the insulating substrate and a coil lower layer part disposed on a second surface of the insulating substrate, the first surface of the insulating substrate being farther away from the shielding sheet than the second surface of the insulating substrate, and a coating layer including a second magnetic material and disposed adjacent to and surrounding the coil upper layer part in a winding structure corresponding to the winding structure of the coil.

The insulating substrate, the coil, and the coating layer may be disposed on a flexible printed circuit board (FPCB).

The second magnetic material included in the coating layer may include at least one of iron or nickel, and the first magnetic material included in the shielding sheet may include a nanocrystal.

The second magnetic material included in the coating layer may be a conductive material or a non-conductive material, the conductive material may include at least one of iron, nickel, cobalt, or an alloy, and the non-conductive material may include at least one of polymer or ceramic ferrite.

The coating layer may include a coating upper layer part disposed adjacent to and surrounding the coil upper layer part and a coating lower layer part disposed adjacent to and surrounding the coil lower layer part.

According to another aspect of an example embodiment, there is provided a portable electronic device including a front surface cover forming a front surface of the portable electronic device, a rear surface cover forming a rear surface of the portable electronic device, a display disposed between the front surface cover and the rear surface cover, and visually exposed through the front surface, a battery disposed between the display and the rear surface cover, and an antenna structure disposed between the battery and the rear surface cover, and configured to charge the battery, wherein the antenna structure may include an insulating substrate, a shielding sheet including a first magnetic material, a coil disposed on the insulating substrate in a winding structure, the coil being wound multiple times in a clockwise and/or a counterclockwise direction around an axis normal to the insulating substrate, and including a coil upper layer part disposed on a first surface of the insulating substrate, the first surface facing the rear surface cover, and a coil lower layer part disposed on a second surface of the insulating substrate, and a coating layer including a second magnetic material and disposed adjacent to and surrounding the coil upper layer part in a winding structure corresponding to the winding structure of the coil.

The insulating substrate, the coil, and the coating layer may be disposed on a flexible printed circuit board (FPCB).

The first magnetic material included in the coating layer may include iron or nickel, and wherein the second magnetic material included in the shielding sheet may include a nanocrystal.

According to various embodiments, an antenna structure may be manufactured with little costs and through simple processes, and may increase wireless charging efficiency. Various other advantageous effects identified explicitly or implicitly through the disclosure may be provided.

BRIEF DESCRIPTION OF DRAWINGS

The above and/or other aspects, features, and advantages of embodiments will be more apparent from the following description taken in conjunction with the accompanying drawings, in which:

FIG. 5B is a cross-sectional view of the AB portion of the antenna structure of FIG. 5A, which is cut in the +z-axis direction;

FIG. 6 is a graph illustrating a correlation between the gap between a coating member and a shielding sheet and the resistance of a coil;

FIGS. 7 and 8 are cross-sectional views of an antenna structure supporting wireless charging according to an embodiment.

DETAILED DESCRIPTION

Figure 1:
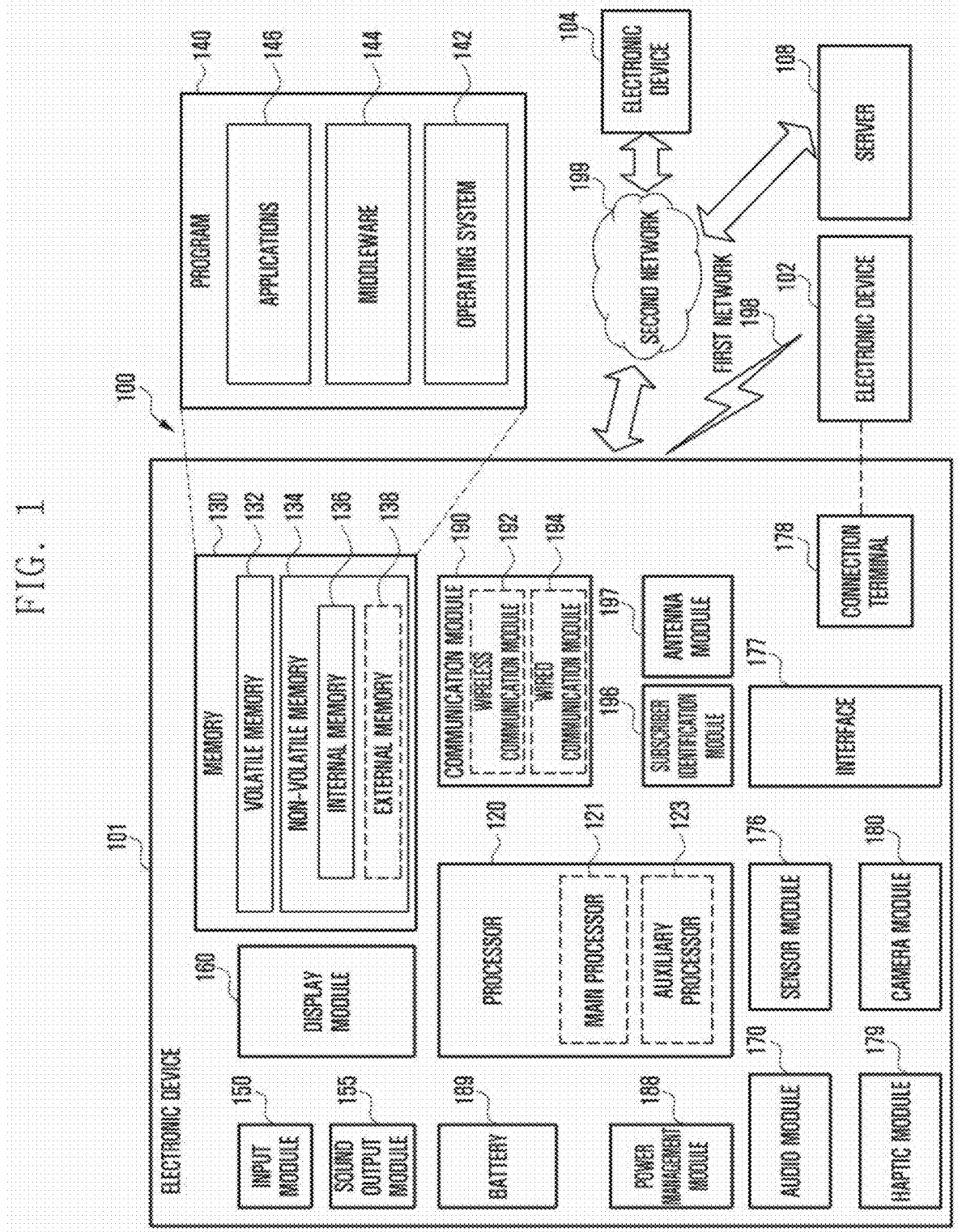
FIG. 1 is a block diagram of an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
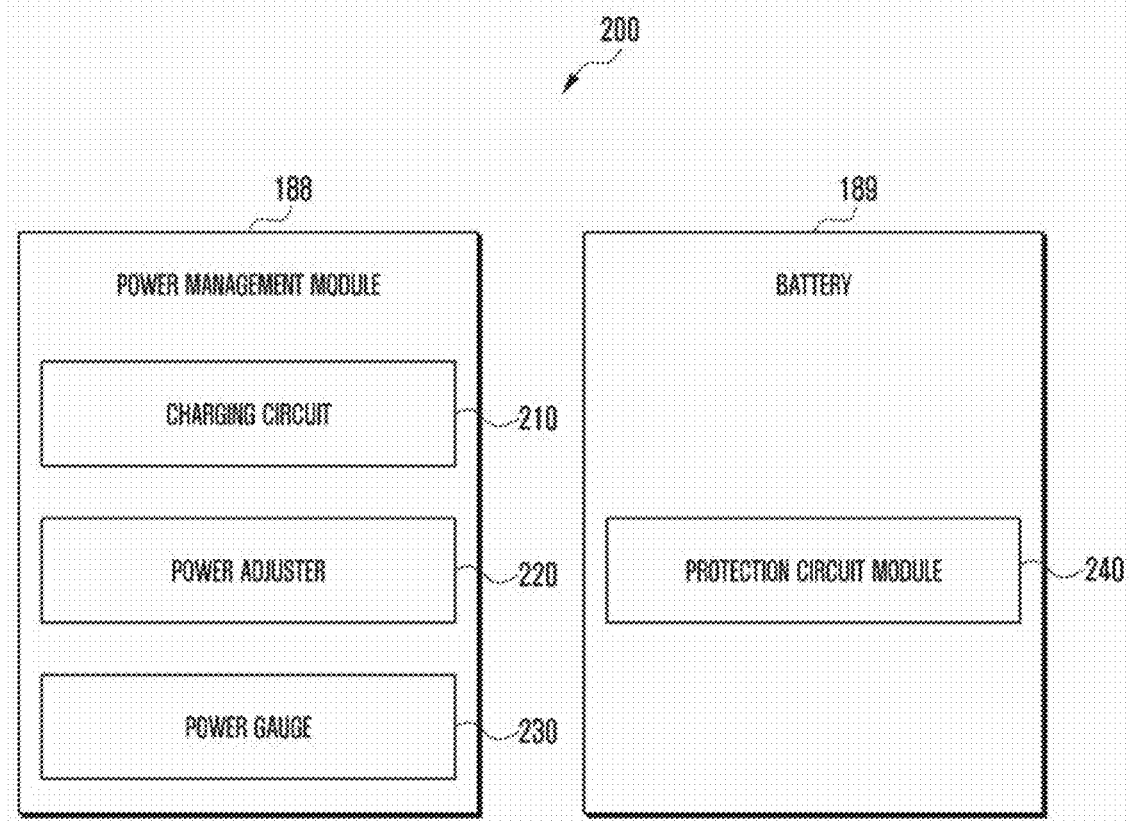
FIG. 2 is a block diagram of a power management module and a battery according to various embodiments.

FIG. 2 is a block diagram 200 illustrating the power management module 188 and the battery 189 according to various embodiments. Referring to FIG. 2, the power management module 188 may include charging circuitry 210, a power adjuster 220, or a power gauge 230. The charging circuitry 210 may charge the battery 189 by using power supplied from an external power source outside the electronic device 101. According to an embodiment, the charging circuitry 210 may select a charging scheme (e.g., normal charging or quick charging) based at least in part on a type of the external power source (e.g., a power outlet, a USB, or wireless charging), magnitude of power suppliable from the external power source (e.g., about 20 Watt or more), or an attribute of the battery 189, and may charge the battery 189 using the selected charging scheme. The external power source may be connected with the electronic device 101, for example, directly via the connecting terminal 178 or wirelessly via the antenna module 197.

The power adjuster 220 may generate a plurality of powers having different voltage levels or different current levels by adjusting a voltage level or a current level of the power supplied from the external power source or the battery 189. The power adjuster 220 may adjust the voltage level or the current level of the power supplied from the external power source or the battery 189 into a different voltage level or current level appropriate for each of some of the components included in the electronic device 101. According to an embodiment, the power adjuster 220 may be implemented in the form of a low drop out (LDO) regulator or a switching regulator. The power gauge 230 may measure use state information about the battery 189 (e.g., a capacity, a number of times of charging or discharging, a voltage, or a temperature of the battery 189).

The power management module 188 may determine, using, for example, the charging circuitry 210, the power adjuster 220, or the power gauge 230, charging state information (e.g., lifetime, over voltage, low voltage, over current, over charge, over discharge, overheat, short, or swelling) related to the charging of the battery 189 based at least in part on the measured use state information about the battery 189. The power management module 188 may determine whether the state of the battery 189 is normal or abnormal based at least in part on the determined charging state information. If the state of the battery 189 is determined to abnormal, the power management module 188 may adjust the charging of the battery 189 (e.g., reduce the charging current or voltage, or stop the charging). According to an embodiment, at least some of the functions of the power management module 188 may be performed by an external control device (e.g., the processor 120).

The battery 189, according to an embodiment, may include a protection circuit module (PCM) 240. The PCM 240 may perform one or more of various functions (e.g., a pre-cutoff function) to prevent a performance deterioration of, or a damage to, the battery 189. The PCM 240, additionally or alternatively, may be configured as at least part of a battery management system (BMS) capable of performing various functions including cell balancing, measurement of battery capacity, count of a number of charging or discharging, measurement of temperature, or measurement of voltage.

According to an embodiment, at least part of the charging state information or use state information regarding the battery 189 may be measured using a corresponding sensor (e.g., a temperature sensor) of the sensor module 176, the power gauge 230, or the power management module 188. According to an embodiment, the corresponding sensor (e.g., a temperature sensor) of the sensor module 176 may be included as part of the PCM 240, or may be disposed near the battery 189 as a separate device.

FIG. 2 is a block diagram 200 illustrating the wireless communication module 192, the power management module 188, and the antenna module 197 of the electronic device 101 according to various embodiments. Referring to FIG. 2, the wireless communication module 192 may include a magnetic secure transmission (MST) communication module 210 or a near-field communication (NFC) module 230, and the power management module 188 may include a wireless charging module 250. In such a case, the antenna module 197 may include a plurality of antennas that include a MST antenna 297-1 connected with the MST communication module 210, a NFC antenna 297-3 connected with the NFC communication module 230, and a wireless charging antenna 297-5 connected with the wireless charging module 250. For ease of description, the same components as those described in regard to FIG. 1 are briefly described or omitted from the description.

The MST communication module 210 may receive a signal containing control information or payment information such as card information from the processor 120, generate a magnetic signal corresponding to the received signal, and then transfer the generated magnetic signal to the external electronic device 102 (e.g., a point-of-sale (POS) device) via the MST antenna 297-1. To generate the magnetic signal, according to an embodiment, the MST communication module 210 may include a switching module (not shown) that includes one or more switches connected with the MST antenna 297-1, and control the switching module to change the direction of voltage or current supplied to the MST antenna 297-1 according to the received signal. The change of the direction of the voltage or current allows the direction of the magnetic signal (e.g., a magnetic field) emitted from the MST antenna 297-1 to change accordingly. If detected at the external electronic device 102, the magnetic signal with its direction changing may cause an effect (e.g., a waveform) similar to that of a magnetic field that is generated when a magnetic card corresponding to the card information associated with the received signal is swiped through a card reader of the electronic device 102. According to an embodiment, for example, payment-related information and a control signal that are received by the electronic device 102 in the form of the magnetic signal may be further transmitted to an external server 108 (e.g., a payment server) via the network 199.

The NFC communication module 230 may obtain a signal containing control information or payment information such as card information from the processor 120 and transmit the obtained signal to the external electronic device 102 via the NFC antenna 297-3. According to an embodiment, the NFC communication module 230 may receive such a signal transmitted from the external electronic device 102 via the NFC antenna 297-3.

The wireless charging module 250 may wirelessly transmit power to the external electronic device 102 (e.g., a cellular phone or wearable device) via the wireless charging antenna 297-5, or wirelessly receive power from the external electronic device 102 (e.g., a wireless charging device). The wireless charging module 250 may support one or more of various wireless charging schemes including, for example, a magnetic resonance scheme or a magnetic induction scheme.

According to an embodiment, some of the MST antenna 297-1, the NFC antenna 297-3, or the wireless charging antenna 297-5 may share at least part of their radiators. For example, the radiator of the MST antenna 297-1 may be used as the radiator of the NFC antenna 297-3 or the wireless charging antenna 297-5, or vice versa. In such a case, the antenna module 197 may include a switching circuit (not shown) adapted to selectively connect (e.g., close) or disconnect (e.g. open) at least part of the antennas 297-1, 297-3, or 297-5, for example, under the control of the wireless communication module 192 (e.g., the MST communication module 210 or the NFC communication module 230) or the power management module (e.g., the wireless charging module 250). For example, when the electronic device 101 uses a wireless charging function, the NFC communication module 230 or the wireless charging module 250 may control the switching circuit to temporarily disconnect at least one portion of the radiators shared by the NFC antenna 297-3 and the wireless charging antenna 297-5 from the NFC antenna 297-3 and to connect the at least one portion of the radiators with the wireless charging antenna 297-5.

According to an embodiment, at least one function of the MST communication module 210, the NFC communication module 230, or the wireless charging module 250 may be controlled by an external processor (e.g., the processor 120). According to an embodiment, at least one specified function (e.g., a payment function) of the MST communication module 210 or the NFC communication module 230 may be performed in a trusted execution environment (TEE). According to an embodiment, the TEE may form an execution environment in which, for example, at least some designated area of the memory 130 is allocated to be used for performing a function (e.g., a financial transaction or personal information-related function) that requires a relatively high level of security. In such a case, access to the at least some designated area of the memory 130 may be restrictively permitted, for example, according to an entity accessing thereto or an application being executed in the TEE.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Various housing structures may be applied to a portable electronic device (e.g., the electronic device 101 of FIG. 1). For example, the portable electronic device may have a bar-type housing structure, a foldable housing structure, or a slidable (or rollable) housing structure. In an embodiment, the bar-type housing structure may include a first cover for forming the front surface of a portable electronic device, a second cover for forming the rear surface of the portable electronic device, and a side surface bezel structure for forming the side surface of the portable electronic device. In an embodiment, the foldable housing structure may include a first housing, a second housing, and a hinge assembly configured to allow the two housings to be rotatable. In the foldable housing structure, a first portion of a display (e.g., a flexible display) may be disposed on the first housing, and a second portion of the display may be disposed on the second housing. The foldable housing structure may be implemented in an in-folding type in which the first portion and the second portion face each other when the portable electronic device is folded. In addition, the foldable housing structure may be also be implemented in an out-folding type in which the first portion and the second portion face toward directions opposite to each other when the portable electronic device is folded. In an embodiment, the slidable housing structure may include a housing, a slider part, and a roller configured to allow a part of the slider part to be introduced into or withdrawn from the housing. As the slider is introduced into the housing, a part of the display (e.g., a flexible display) may go inside the housing.

Hereinafter, for the convenience of descriptions, the surface, in which the display (e.g., a flexible display) is visually exposed to the user, may be referred to as the front surface (or a first surface) of the portable electronic device. In addition, a surface opposite to the front surface may be referred to as the rear surface (or a second surface) of the portable electronic device. In addition, a surface being disposed adjacent to and surrounding the space between the front surface and the rear surface may be referred to as the side surface of the portable electronic device. In an embodiment, the portable electronic device may further include a separate sub-display which is visually exposed through the rear surface.

Figure 4:
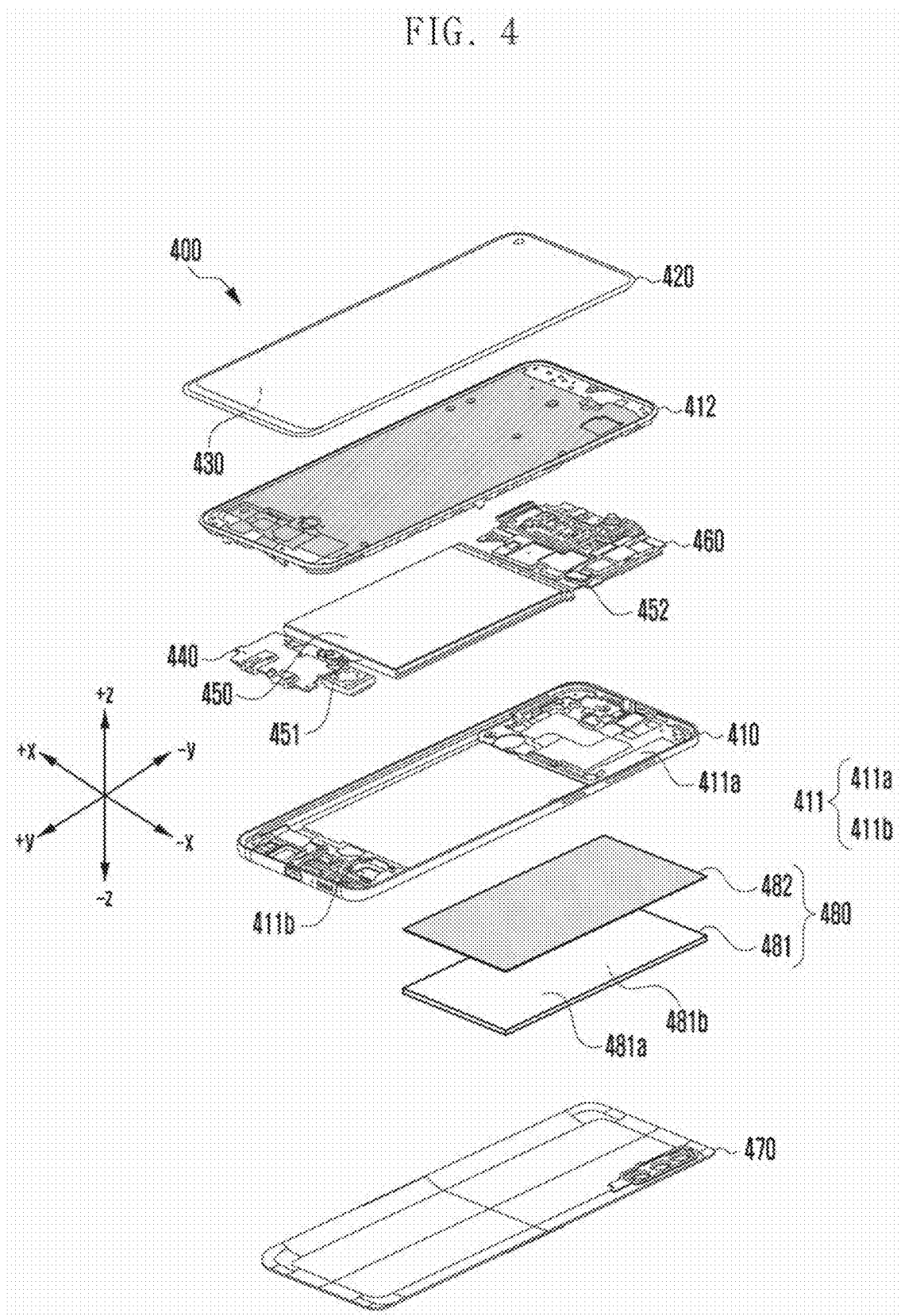
FIG. 4 illustrates a portable electronic device having a bar-type housing structure according to an embodiment.

FIG. 4 illustrates a portable electronic device 400 having a bar-type housing structure according to an embodiment.

Referring to FIG. 4, a portable electronic device 400 (e.g., the electronic device 101 of FIG. 1) may include a side surface bezel structure 410 (or a side surface frame), a first supporting member 411 (or a first support frame), a second supporting member 412 (or second support frame), a front surface plate 420 (or a front surface cover), a display 430 (e.g., the display module 160 of FIG. 1), at least one printed circuit board 440 or 460, a battery pack 450 (e.g., the battery 189 of FIG. 2), a rear surface plate 470 (or a rear surface cover), and an antenna structure 480. The front surface plate 420 may form the front surface of the portable electronic device 400, which faces a first direction (the +z-axis direction of FIG. 4), the rear surface plate 470 may form the rear surface of the portable electronic device 400, which faces a second direction (the −z-axis direction of FIG. 4) opposite to the first direction, and the side surface bezel structure 410 may be made of a combination of metal (e.g., SUS) and polymer and may form the side surface thereof being disposed adjacent to and surrounding a space between the front surface and the rear surface. According to an embodiment, the structure including the front surface, the rear surface, and the side surface may be referred to as a housing structure. In some embodiments, at least one of the elements (e.g., the first supporting member 411 or the second supporting member 412) of the portable electronic device 400 may be omitted, or other elements may be additionally included in the portable electronic device 400.

The printed circuit boards 440 and 460 may be disposed to be supported by the first supporting member 411 and/or the second supporting member 412. The first supporting member 411 may be coupled to the side surface bezel structure 410. The first supporting member 411 may include a structure (e.g., metal and/or polymer) configured to extend from the side surface bezel structure 410. For example, the first supporting member 411 may be made of a metal and/or a non-metal material (e.g., polymer). The display 430 may be coupled to one surface of the second supporting member 412, and the printed circuit boards 440 and 460 may be coupled to the other surface thereof. According to an embodiment, the printed circuit boards 440 and 460 may include a first substrate 440 (or a sub-substrate) and a second substrate 460 (or a main substrate) which are respectively arranged at both sides of the battery pack 450 that is interposed therebetween. For example, the first substrate 440 may be positioned adjacent to a first side 451 of the battery pack 450, which faces the +y-axis direction, and the second substrate 460 may be positioned adjacent to a second side 452 of the battery pack 450, which faces the −y-axis direction. The first supporting member 411 may include a second substrate supporting member 411a configured to support the second substrate 460 and a first substrate supporting member 411b configured to support the first substrate 440. The battery pack 450 may be disposed to be supported by the first supporting member 411 and/or the second supporting member 412. The battery 450 may be a device for supplying power to at least one element of the electronic device 400, and may include a rechargeable secondary cell. The battery pack 450 may be positioned between the first substrate 440 and the second substrate 460. The battery pack 450 may be disposed on the substantially same plane surface as the printed circuit boards 440 and 460.

Figure 3:
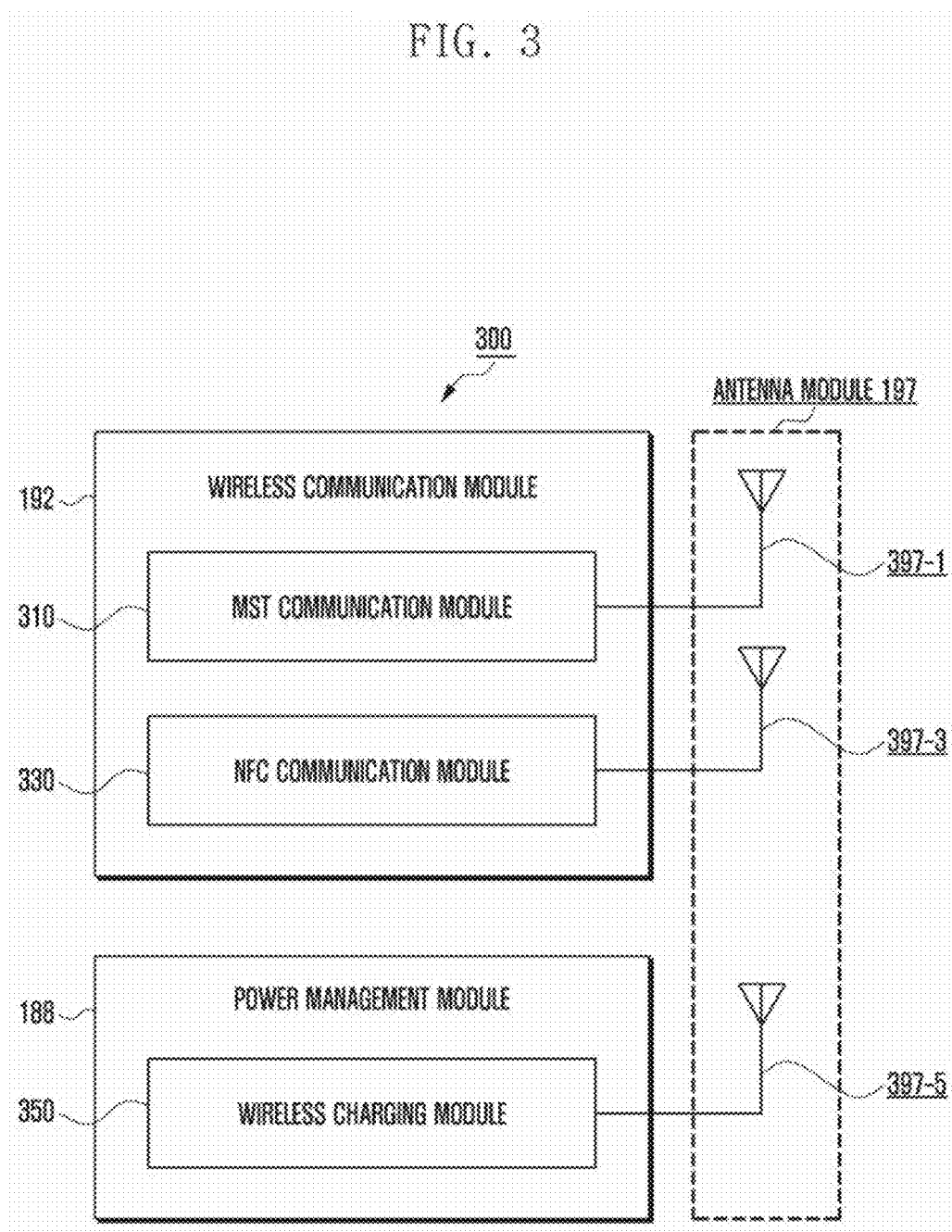
FIG. 3 is a block diagram of a wireless communication module, a power management module, and an antenna module of an electronic device according to various embodiments.

The antenna structure 480 may include a flexible printed circuit board (FPCB) 481 and a shielding sheet 482. The FPCB 481 may include at least one antenna (e.g., the MST antenna 397-1, the NFC antenna 397-3, and/or a wireless charging antenna 397-5 of FIG. 3). Here, the antenna (e.g., the wireless charging antenna 397-5) may be a spiral-type coil wound multiple times in a clockwise and/or a counterclockwise direction around the z-axis. The FPCB 481 may further include a magnetic material for inducing a magnetic flux generated in the antenna in the second direction (the −z-axis direction). The FPCB 481 may include multiple layers, and may have an antenna and/or a magnetic material partially formed on each of the multiple layers. The shielding sheet 482 may be positioned between the printed circuit boards 440 and 460 and the FPCB 481 to induce the magnetic flux generated in the antenna of the FPCB 481 in the second direction (the −z-axis direction) and to shield the battery pack 450 and the printed circuit boards 440 and 460 from the magnetic flux. For example, the shielding sheet 482 may be attached to one surface 481*a* of the FPCB 481, and the rear surface cover 470 may be attached to the other surface 481*b* of the FPCB 481.

Although not illustrated therein, the antenna structure 480 may be also configured in a portable electronic device having a foldable housing structure or a slidable housing structure.

Figure 5A:
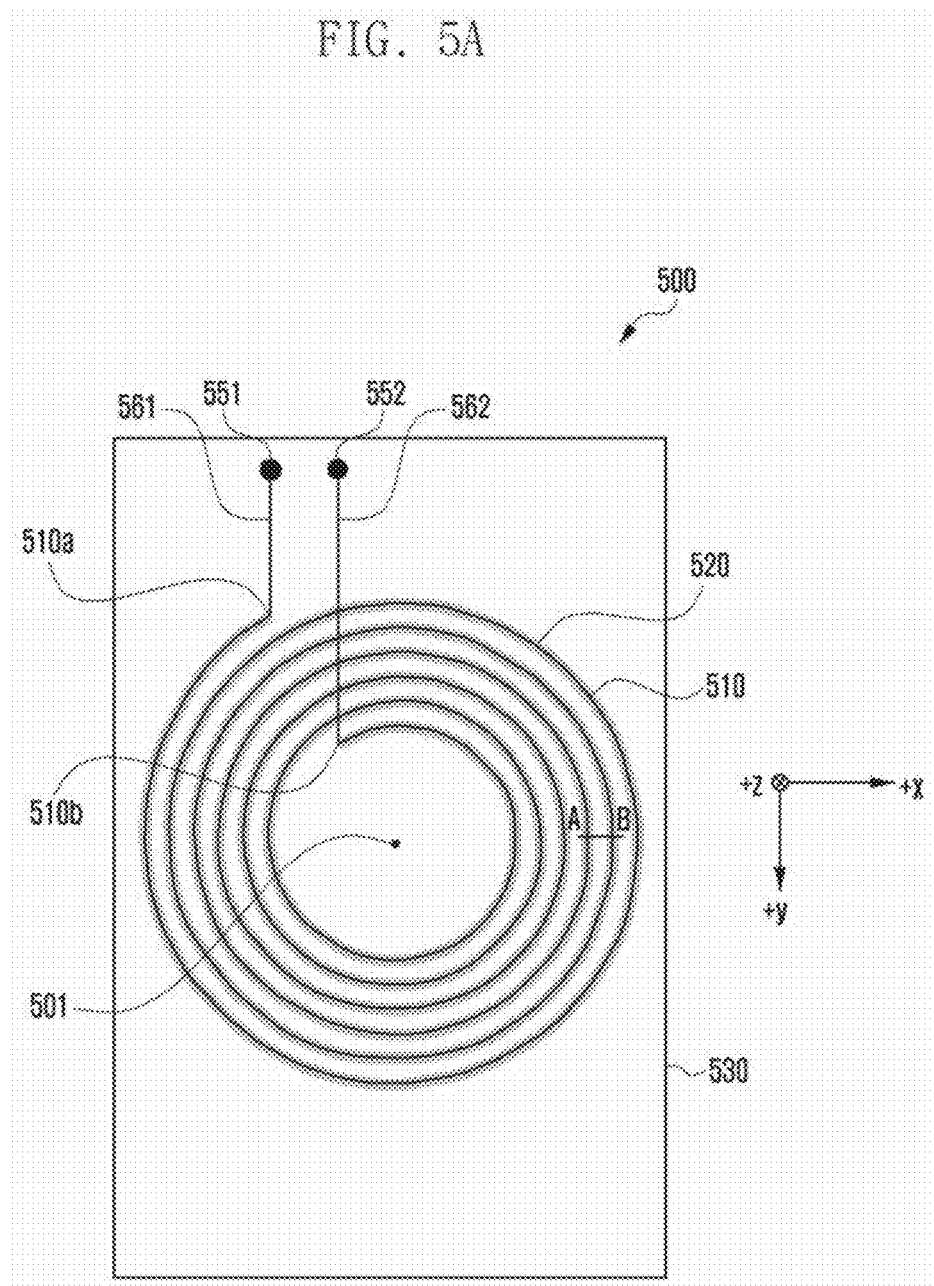
FIG. 5A is a view illustrating the front of an antenna structure supporting wireless charging according to an embodiment.

FIG. 5A is a view illustrating the front of an antenna structure 500 supporting wireless charging (e.g., a wireless power consortium (WPC)) according to an embodiment, and FIG. 5B is a cross-sectional view of the AB portion of the antenna structure 500 of FIG. 5A, which is cut in the +z-axis direction. According to an embodiment, as illustrated in FIG. 5B, an antenna structure 500 may be implemented in a single layer coil structure in which a coil 510 is formed on one layer. FIG. 6 is a graph illustrating a correlation between the gap g (μm) between a coating member 520 and a shielding sheet 550 and the resistance R (ohm) of a coil 510.

Referring to FIGS. 5A and 5B, the antenna structure 500 may include the coil 510, the coating member 520, an insulating substrate 530 (an insulating layer), a spacer 540, and a shielding sheet 550 (a shielding layer or a shielding member). For example, the shielding sheet 550 may be the shielding sheet 482 of FIG. 4. The coil 510, the coating member 520, the insulating substrate 530, and the spacer 540 may be configured on the FPCB 481 of FIG. 4.

The coil 510 may be formed on the antenna structure 500 in a structure in which the coil is wound multiple times in a clockwise and/or a counterclockwise direction around an axis 501 (an axis parallel to the z-axis direction illustrated therein) which is perpendicular (normal) to the insulating substrate 530. The winding structure of the coil 510 illustrated in FIG. 5A is a round shape, but may not be limited thereto. For example, at least a part of the coil 510 may have an angular shape (e.g., a quadrilateral shape). One end 510*a* of the coil 510 may be electrically connected to a first conductive pad 551 formed on the antenna structure 500 through a first conductive wire 561. The other end 510*b* of the coil 510 may be electrically connected to a second conductive pad 552 formed on the antenna structure 500 through a second conductive wire 562. The conductive pads 551 and 552 may be electrically connected to a wireless charging circuit (e.g., the wireless charging module 350 of FIG. 3). The wireless charging circuit, through the coil 510, may transmit power to an external electronic device or receive power from an external electronic device. For example, in the wireless charging circuit, alternating current may flow through the conductive pads 551 and 552 to the coil 510. A magnetic flux is induced in the coil 510 by alternating current, and a magnetic field may be formed around the antenna structure 500 (e.g., outside the rear surface cover 470 of FIG. 4). Alternating current may be induced in the coil 510 by the magnetic flux induced in a coil of an external electronic device. The coil 510 may transmit the induced alternating current to the wireless charging circuit through the conductive pads 551 and 552.

The coil 510 may be formed on one surface 530*a* of the insulating substrate 530, the spacer 540 may be attached to the other surface 530*b* of the insulating substrate 530, and the shielding sheet 550 may be attached to the spacer 540. The coating member 520 may cover the coil 510. For example, after the coil 510 is formed on the one surface 530*a* of the insulating substrate 530, the magnetic material may be plated on the surface of the coil 510. Accordingly, the coating member 520 having a winding structure, in which the coating member is wound multiple times identical to the winding structure of the coil 510, may be formed on the one surface 530*a* of the insulating substrate 530 while being disposed adjacent to and surrounding the coil 510. The magnetic material used as the coating member 510 may be an object having a relative permeability greater than one. A first conductive material (e.g., copper) may constitute the coil 510, and a second conductive material different from the first conductive material may be used as the coating member 520 for surrounding the coil 510. For example, the second conductive material may include at least one of iron, nickel, cobalt, or an alloy (e.g., a nanocrystal). A non-conductive material (e.g., polymer or ceramic ferrite) may be also used as the coating member 520. Although not illustrated therein, the coating member 520 may also be provided on and cover the first conductive wire 561 and the second conductive wire 562.

The electrical coupling between a coil for transmitting power and a coil for receiving power may be closely associated with the power transmission efficiency. The coating member 520 may be an element for covering the coil 510 as a complement for inducing the magnetic flux generated by the coil 510 in the +z-axis direction, and when the area, in which the coil and the insulating substrate 530 are contact with each other, increases, the power transmission efficiency may decrease. For example, as illustrated in FIG. 5B, when viewing the coating member 520 while facing the y-axis direction, a first coating portion 520*a* of the coating member 520 may cover the first portion 510*a* of the coil 510, a second coating portion 520*b* of the coating member 520 may cover the second portion 510*b* of the coil 510, and the first coating portion 520*a* and the second coating portion 520*b* may be separated from each other without a physical connection. In the case of the structure in which the first coating portion 520*a* and the second coating portion 520*b* are separated from each other, the coating member 520 may induce a magnetic flux in the +z-axis direction to improve power transmission efficiency. In the case of a structure in which a third coating portion 520*c* for covering up to the insulating portion 530*a*, positioned between the first coil portion 510*a* and the second coil portion 510*b*, is added to the coating member 520, the numerical value (e.g., a coupling coefficient) indicating the degree of the electrical coupling may be reduced, and as a result, the power transmission efficiency may be lower than the power transmission efficiency expected at the time of the separation structure.

Referring to FIG. 6, when a current flows through the coil 510, the magnetic flux generated thereby may pass through the coating member 520 which surrounds the coil 510, and thus energy loss may occur in the coating member 520. A loss tangent may be defined as the measurement indicating how much energy is dissipated by the coating member 520. A magnetic material having a loss tangent of 0, 0.1, 0.2, and 0.3 may be used as the coating member 520, however, embodiments are not limited thereto. Graphs of FIG. 6 obtained through experiments illustrate that when a magnetic material having a relatively small loss tangent value is used as the coating member 520, the resistance of the coil 510 becomes relatively small. In addition, when the gap 502 (e.g., the sum of the thickness of the spacer 540 and the thickness of the substrate 530) between the coating member 520 and the shielding sheet 550 is at a predetermined level (e.g., about 5 μm) or more, wireless charging efficiency can be maximized. In order to improve wireless charging efficiency, a magnetic material having relatively low energy loss may be used as the coating member 520. The gap 502 may be set based on the inherent energy loss characteristic of the magnetic material constituting the coating member 520. For example, when the resistance value required for the coil 510 is about 400 ohms or less, a magnetic material having a loss tangent value of about 0.3 or less may be used as the coating member 520. In addition, the gap 502 between the coating member 520 and the shielding sheet 550 may be set to at least 5-10 μm.

The spacer 540 may be included in the antenna structure 500 as a complement for fitting the gap 502 between the coating member 520 and the shielding sheet 550 to a designated critical distance (e.g., about 5-10 μm) or more. The coating member 520 may be spaced apart from the shielding sheet 550 by the critical distance or more so that the magnetic flux flowing through the shielding sheet 550 does not leak to the magnetic material 520. When the insulating substrate 530 is implemented to have a thickness greater than or equal to the critical distance, compensation in the thickness is not required, and thus the spacer 540 may be omitted from the antenna structure 500. The spacer 540 may be made of an insulating material. For example, the spacer 540 may be made of a polyimide (PI) film. The spacer 540 may be attached to the insulating substrate 530 through an adhesive material (not shown). When the spacer 540 is not required, the shielding sheet 550 may be attached to the insulating substrate 530 through the adhesive material.

The shielding sheet 550 may be implemented in a magnetic material having a relative permeability higher than the coating member 520. For example, the coating member 520 may be implemented in iron or nickel, and the shielding sheet 550 may be implemented in a nanocrystal having a relatively high relative permeability.

The relative permeability of the coating member 510 may be considered as a factor for determining the critical distance. For example, as the magnetic material used as the coating member 510 has a lower relative permeability, the critical distance may become relatively short.

Figure 8:
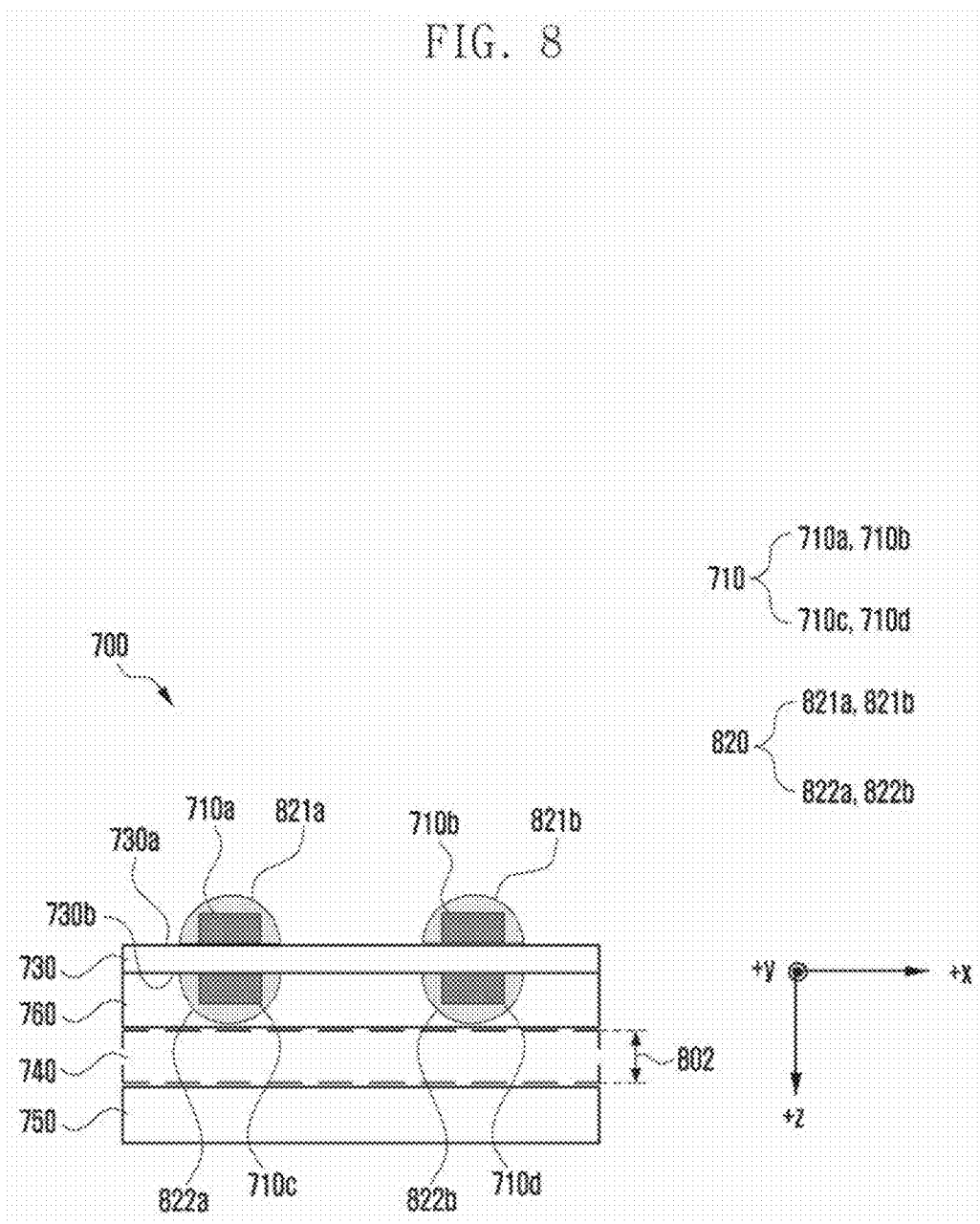

FIGS. 7 and 8 are cross-sectional views of an antenna structure 700 supporting wireless charging according to an embodiment. For example, FIGS. 7 and 8 may correspond to cross-sectional views of the AB portion of the antenna structure 500 of FIG. 5A, which is cut in the +z-axis direction.

According to an embodiment, as illustrated in FIGS. 7 and 8, the antenna structure may be implemented in a multi-layer coil structure in which a coil is partially formed on multiple layers. For example, as illustrated in FIGS. 7 and 8, the antenna structure 700 may be implemented in a double-layer coil structure in which a coil 710 is partially formed on two layers. Among the two layers, a layer, which is positioned relatively far from a shielding sheet 750, may be referred to as an upper layer (or a first layer), and the other layer, which is positioned closer to the shielding sheet 750, may be referred to as a lower layer (or a second layer). According to the naming, coils may be divided into an upper layer part (or a first layer part) positioned on the upper layer and a lower layer part (or a second layer part) positioned on the lower layer. According to the embodiment of FIG. 7, the antenna structure 700 may be implemented in a single-sided coating structure in which a coating member 720 covers only the coil upper layer part. According to the embodiment of FIG. 8, the antenna structure 700 may be implemented in a double-sided coating structure in which a coating member 820 covers both the coil upper layer part and the coil lower layer part.

Figure 9:
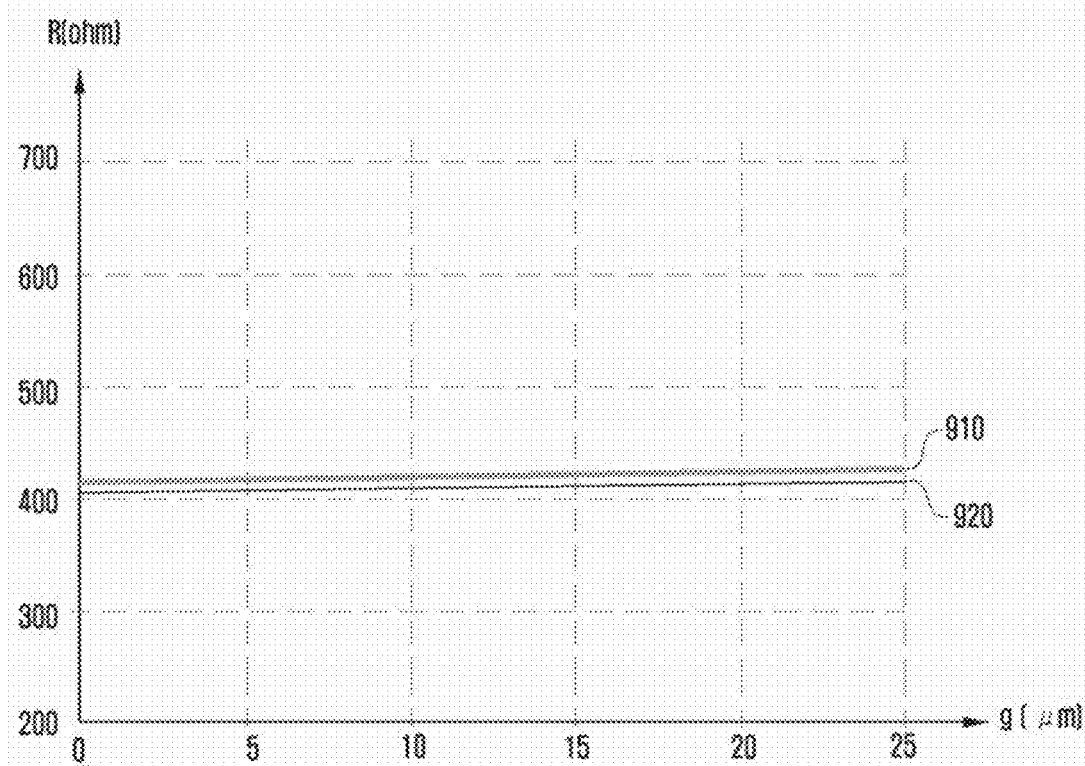
FIG. 9 illustrates graphs showing a correlation between the gap between a coating member and a shielding sheet and the resistance of a coil, in the antenna structures of FIGS. 7 and 8.

FIG. 9 illustrates a first graph 910 showing a correlation between the gap g and the resistance R when the antenna structure is implemented in the single-sided coating structure while having the double-layer coil structure, and a second graph 920 showing a correlation between the gap g and the resistance R when the antenna structure is implemented in the double-sided coating structure while having the double-layer coil structure.

Referring to FIG. 7, the antenna structure 700 may include a coil 710, a coating member 720, an insulating substrate 730, a spacer 740, a shielding sheet 750, and an adhesive material 760. Descriptions of elements having the same names as the elements of FIG. 5A and FIG. 5B will be omitted or be simply described.

Upper layer parts 710*a* and 710*b* (or a first coil part) of the coil 710 may be formed on one surface 730*a* (top surface) of the insulating substrate 730, and lower layer parts 710*c* and 710*d* (or a second coil part) of the coil 710 may be formed on the other surface 730*b* (bottom surface) of the insulating substrate 730. The coil lower layer parts 710*c* and 710*d* may be respectively electrically connected to the coil upper layer parts 710*a* and 710*b* through a conductive via (not shown) penetrating the insulating substrate 730 in the z-axis direction.

The other surface 730*b* of the insulating substrate 730, on which the coil lower layer parts 710*c* and 710*d* are formed, may be attached to the spacer 740 through the adhesive material 760. For example, the adhesive material 760 in a liquid state may be applied to the other surface 730*b* of the insulating substrate 730. After a planarization operation is performed on the applied adhesive material 760, the spacer 740 may be attached to the adhesive material 760, and the shielding sheet 750 may be attached to the spacer 740.

The coating member 720 may cover the coil upper layer parts 710*a* and 710*b*. For example, after the coil upper layer parts 710*a* and 710*b* of the coil 710 are formed on the one surface 730*a* of the insulating substrate 730, the magnetic material may be plated on the surfaces of the coil upper layer parts 710*a* and 710*b*. Accordingly, the coating member 720 having a structure in which the coating member is wound multiple times identical to the winding structure of the coil 710, may be formed on the one surface 730*a* of the insulating substrate 730 while surrounding the coil upper layer parts 710*a* and 710*b*.

As illustrated in FIG. 7, when seeing the coating member 720 while facing the y-axis direction, a first coating portion 720*a* of the coating member 720 may cover the first portion 710*a* of the coil upper layer parts 710*a* and 710*b*, a second coating portion 720*b* of the coating member 720 may cover the second portion 710*b* of the coil upper layer parts 710*a* and 710*b*, and the first coating portion 720*a* and the second coating portion 720*b* may be separated from each other without a physical connection.

Referring to FIG. 8, a coating member 820 may include upper layer parts 821*a* and 821*b* (or a first layer part) (e.g., the coating member 720 of FIG. 7) for covering the coil upper layer parts 710*a* and 710*b*, and lower layer parts 822*a* and 822*b* (or a second layer part) for covering the coil lower layer parts 710*c* and 710*d*. For example, a magnetic material may be plated on the surfaces of the coil upper layer parts 710*a* and 710*b*, and thus the coating upper layer parts 821*a* and 821*b* having a structure in which the coating upper layer parts are wound multiple times identical to the winding structure of the coil 710, may be formed on the one surface 730*a* of the insulating substrate 730 while surrounding the coil upper layer parts 710*a* and 710*b*. A magnetic material may be plated on the surfaces of the coil lower layer parts 710*c* and 710*d*, and thus the coating lower layer parts 822*a* and 822*b* having a structure in which the coating lower layer parts are wound multiple times identical to the winding structure of the coil 710, may be formed on the other surface 730*b* of the insulating substrate 730 while surrounding the coil lower layer parts 710*c* and 710*d*.

As illustrated in FIG. 8, when viewing the coating member 820 while facing the y-axis direction, the first coating portion 821*a* of the coating upper layer parts 821*a* and 821*b* may cover the first portion 710*a* of the coil upper layer parts 710*a* and 710*b*, the second coating portion 821*b* of the coating upper layer parts 821*a* and 821*b* may cover the second portion 710*b* of the coil upper layer parts 710*a* and 710*b*, and the first coating portion 821*a* and the second coating portion 821*b* may be separated from each other without a physical connection. The third coating portion 822*a* of the coating lower layer parts 822*a* and 822*b* may cover the third portion 710*c* of the coil lower layer parts 710*c* and 710*d*, the fourth coating portion 822*b* of the coating lower layer parts 822*a* and 822*b* may cover the fourth portion 710*d* of the coil lower layer parts 710*c* and 710*d*, and the third coating portion 822*a* and the fourth coating portion 822*b* may be separated from each other without being physically connected.

Referring to FIG. 9, the graphs 910 and 920 of FIG. 9 may be obtained by changing the thickness of the spacer 740 and measuring the resistance change of the coil 710 according thereto. The first graph 910 shows a resistance change according to the change in the gap 702 (e.g., the thickness of the spacer 740) between the coil lower layer parts 710*c* and 710*d* and the shielding sheet 750 in the antenna structure 700 of FIG. 7. The second graph 920 shows a resistance change according to the change in the gap 802 (e.g., the thickness of the spacer 740) between the coil lower layer parts 710*c* and 710*d*, which are respectively coated by the coating lower layer parts 822*a* and 822*b*, and the shielding sheet 750, in the antenna structure 700 of FIG. 8. The two graphs 910 and 920 illustrates that the coating on the coil lower layer parts 710*c* and 710*d* has no significant effect on the resistance. Therefore, for the convenience of the process, the coating lower layer parts 822*a* and 822*b* may be omitted from the antenna structure 700. For example, the antenna structure 700 may be implemented in the structure illustrated in FIG. 7. The two graphs 910 and 920 further illustrate that, when the antenna structure is implemented in a single-layer coil structure as FIG. 5B, the spacer is helpful in the wireless charging efficiency, but when the antenna structure is implemented in a multi-layer coil structure as FIGS. 7 and 8, the spacer is not relatively helpful in the wireless charging efficiency. Therefore, the spacer 740 may be omitted from the antenna structure 700. For example, the shielding sheet 750 may be attached to the adhesive material 760 instead of the spacer 740.

In various embodiments, an antenna structure (e.g., the antenna structure 500 of FIGS. 5A-B) for wireless charging may include an insulating substrate, a coil formed on one surface of the insulating substrate in a winding structure in which the coil is wound multiple times in a clockwise and/or a counterclockwise direction around an axis perpendicular to the insulating substrate, a coating member which includes a first magnetic material and is configured to surround the coil while having the same winding structure as the winding structure of the coil and a shielding sheet which includes a second magnetic material and is configured to face the other surface of the insulating substrate.

The antenna structure may further include a spacer configured to space the shielding sheet apart from the coil by a designated critical distance or more so as to reduce a magnetic flux generated in the coil and leaked to the coating member through the shielding sheet. The critical distance may be determined based on an inherent energy loss characteristic of the first magnetic material constituting the coating member.

The insulating substrate, the coil, and the coating member may be configured on a flexible printed circuit board (FPCB).

The first magnetic material constituting the coating member may include iron or nickel, and the second magnetic material constituting the shielding sheet may include a nanocrystal.

The first magnetic material constituting the coating member may be made of a conductive material or a non-conductive material, the conductive material may include at least one of iron, nickel, cobalt, or an alloy, and the non-conductive material may include at least one of polymer or ceramic ferrite.

In various embodiments, a portable electronic device (e.g., the portable electronic device 400 of FIG. 4) may include a front surface cover configured to form a front surface of the portable electronic device, a rear surface cover configured to form a rear surface of the portable electronic device, a display disposed between the front surface cover and the rear surface cover and visually exposed through the front surface, a battery disposed between the display and the rear surface cover, and an antenna structure (e.g., the antenna structure 500 of FIGS. 5A-B) disposed between the battery and the rear surface cover and configured to charge the battery. The antenna structure may include an insulating substrate, a coil formed on one surface of the insulating substrate in a winding structure in which the coil is wound multiple times in a clockwise and/or a counterclockwise direction around an axis perpendicular to the insulating substrate, the one surface facing the rear surface cover, a coating member which includes a first magnetic material and is configured to surround the coil while having the same winding structure as the winding structure of the coil, and a shielding sheet which includes a second magnetic material and is disposed between the battery and the insulating substrate.

The antenna structure may further include a spacer configured to space the shielding sheet apart from the coil by a designated critical distance or more so as to reduce a magnetic flux generated in the coil and leaked to the coating member through the shielding sheet. The critical distance may be determined based on an energy loss characteristic of the first magnetic material constituting the coating member.

The insulating substrate, the coil, and the coating member may be configured on a flexible printed circuit board (FPCB).

The first magnetic material constituting the coating member may include at least one of iron or nickel, and the second magnetic material constituting the shielding sheet may include a nanocrystal.

The first magnetic material constituting the coating member may be made of a conductive material or a non-conductive material, the conductive material may include at least one of iron, nickel, cobalt, or an alloy, and the non-conductive material may include at least one of polymer or ceramic ferrite.

In various embodiments, an antenna structure (e.g., the antenna structure 700 of FIGS. 7-8) for wireless charging may include an insulating substrate; a shielding sheet including a first magnetic material, a coil which is formed on the insulating substrate in a winding structure in which the coil is wound multiple times in a clockwise and/or a counter-clockwise direction around an axis perpendicular to the insulating substrate, and includes a coil upper layer part formed on one surface among both surfaces of the insulating substrate, the one surface being positioned relatively far from the shielding sheet, and a coil lower layer part formed on the other surface of the insulating substrate; and a coating member which includes a second magnetic material and is configured to surround the coil upper layer part while having the same winding structure as the winding structure of the coil.

The insulating substrate, the coil, and the coating member may be configured on a flexible printed circuit board (FPCB).

The second magnetic material constituting the coating member may include at least one of iron or nickel, and the first magnetic material constituting the shielding sheet may include a nanocrystal.

The second magnetic material constituting the coating member may be made of a conductive material or a non-conductive material, the conductive material may include at least one of iron, nickel, cobalt, or an alloy, and the non-conductive material may include at least one of polymer or ceramic ferrite.

The coating member may include a coating upper layer part configured to surround the coil upper layer part and a coating lower layer part configured to surround the coil lower layer part.

In various embodiments, a portable electronic device (e.g., the portable electronic device 400 of FIG. 4) may include a front surface cover configured to form a front surface of the portable electronic device, a rear surface cover configured to form a rear surface of the portable electronic device, a display disposed between the front surface cover and the rear surface cover and visually exposed through the front surface, a battery disposed between the display and the rear surface cover, and an antenna structure (e.g., the antenna structure 700 of FIGS. 7-8) disposed between the battery and the rear surface cover and configured to charge the battery. The antenna structure may include an insulating substrate, a shielding sheet including a first magnetic material, a coil which is formed on the insulating substrate in a winding structure in which the coil is wound multiple times in a clockwise and/or a counterclockwise direction around an axis perpendicular to the insulating substrate, and includes a coil upper layer part formed on one surface among both surfaces of the insulating substrate, the one surface facing the rear surface cover, and a coil lower layer part formed on the other surface of the insulating substrate, and a coating member which includes a second magnetic material and is configured to surround the coil upper layer part while having the same winding structure as the winding structure of the coil.

The insulating substrate, the coil, and the coating member may be configured on a flexible printed circuit board (FPCB).

The first magnetic material constituting the coating member may include iron or nickel, and the second magnetic material constituting the shielding sheet may include a nanocrystal.

While embodiments have been described with reference to the figures, it will be understood by those of ordinary skill in the art that various changes in form and details may be made therein without departing from the spirit and scope as defined by the following claims and their equivalents.

What is claimed is:

1. An antenna structure configured to wirelessly charge, the antenna structure comprising:
   an insulating substrate;
   a coil disposed on a first surface of the insulating substrate in a winding structure, the coil being wound multiple times in a clockwise or a counterclockwise direction around an axis normal to the insulating substrate;
   a coating layer comprising a first magnetic material, the coating layer being disposed adjacent to and surrounding the coil in a winding structure corresponding to the winding structure of the coil;
   a shielding sheet comprising a second magnetic material and facing a second surface of the insulating substrate opposite to the first surface of the insulating substrate;
   a spacer configured to space the shielding sheet apart from the coil by a critical distance or more to reduce a magnetic flux generated in the coil and leaked to the coating layer through the shielding sheet; and
   an adhesive layer between the insulating substrate and the spacer.

2. The antenna structure of claim 1, wherein the critical distance is obtained based on an inherent energy loss characteristic of the first magnetic material included in the coating layer.

3. The antenna structure of claim 1, wherein the insulating substrate, the coil, and the coating layer are disposed on a flexible printed circuit board (FPCB).

4. The antenna structure of claim 1, wherein the first magnetic material included in the coating layer comprises iron or nickel, and
   wherein the second magnetic material included in the shielding sheet comprises a nanocrystal.

5. The antenna structure of claim 1, wherein the first magnetic material included in the coating layer is a conductive material or a non-conductive material,
   wherein the conductive material comprises at least one of iron, nickel, cobalt, or an alloy thereof, and
   wherein the non-conductive material comprises at least one of polymer or ceramic ferrite.

6. A portable electronic device comprising:
   a front surface cover forming a front surface of the portable electronic device;
   a rear surface cover forming a rear surface of the portable electronic device;
   a display disposed between the front surface cover and the rear surface cover, and visually exposed through the front surface;
   a battery disposed between the display and the rear surface cover; and
   an antenna structure disposed between the battery and the rear surface cover, and configured to charge the battery,
   wherein the antenna structure comprises:
   an insulating substrate;
   a coil disposed on a first surface of the insulating substrate in a winding structure, the coil being wound a certain number of times in a clockwise or a counterclockwise direction around an axis normal to the insulating substrate, the first surface facing the rear surface cover;

a coating layer comprising a first magnetic material, the coating layer being disposed adjacent to and surrounding the coil in a winding structure corresponding to the winding structure of the coil;

a shielding sheet comprising a second magnetic material and disposed between the battery and the insulating substrate;

a spacer configured to space the shielding sheet apart from the coil by a critical distance or more to reduce a magnetic flux generated in the coil and leaked to the coating layer through the shielding sheet; and an adhesive layer between the insulating substrate and the spacer.

7. The portable electronic device of claim 6, wherein the critical distance is obtained based on an energy loss characteristic of the first magnetic material included in the coating layer.

8. The portable electronic device of claim 6, wherein the insulating substrate, the coil, and the coating layer are disposed on a flexible printed circuit board (FPCB).

9. The portable electronic device of claim 6, wherein the first magnetic material included in the coating layer comprises at least one of iron or nickel, and wherein the second magnetic material included in the shielding sheet comprises a nanocrystal.

10. The portable electronic device of claim 6, wherein the first magnetic material included in the coating layer is a conductive material or a non-conductive material, wherein the conductive material comprises at least one of iron, nickel, cobalt, or an alloy, and wherein the non-conductive material comprises at least one of polymer or ceramic ferrite.

11. An antenna structure configured to wirelessly charge, the antenna structure comprising:

an insulating substrate;

a shielding sheet comprising a first magnetic material;

a coil disposed on the insulating substrate in a winding structure, the coil being wound multiple times in a clockwise or a counterclockwise direction around an axis normal to the insulating substrate, and comprising a coil upper layer part disposed on a first surface of the insulating substrate and a coil lower layer part disposed on a second surface of the insulating substrate, the first surface of the insulating substrate being farther away from the shielding sheet than the second surface of the insulating substrate;

a coating layer comprising a second magnetic material and disposed adjacent to and surrounding the coil upper layer part in a winding structure corresponding to the winding structure of the coil;

a spacer configured to space the shielding sheet apart from the coil by a critical distance or more to reduce a magnetic flux generated in the coil and leaked to the coating layer through the shielding sheet; and an adhesive layer between the insulating substrate and the spacer.

12. The antenna structure of claim 11, wherein the insulating substrate, the coil, and the coating layer are disposed on a flexible printed circuit board (FPCB).

13. The antenna structure of claim 11, wherein the second magnetic material included in the coating layer comprises at least one of iron or nickel, and wherein the first magnetic material included in the shielding sheet comprises a nanocrystal.

14. The antenna structure of claim 11, wherein the second magnetic material included in the coating layer is a conductive material or a non-conductive material, wherein the conductive material comprises at least one of iron, nickel, cobalt, or an alloy, and wherein the non-conductive material comprises at least one of polymer or ceramic ferrite.

15. The antenna structure of claim 11, wherein the coating layer comprises:

a coating upper layer part disposed adjacent to and surrounding the coil upper layer part and a coating lower layer part disposed adjacent to and surrounding the coil lower layer part.

16. A portable electronic device comprising:

a front surface cover forming a front surface of the portable electronic device;

a rear surface cover forming a rear surface of the portable electronic device;

a display disposed between the front surface cover and the rear surface cover, and visually exposed through the front surface;

a battery disposed between the display and the rear surface cover; and an antenna structure disposed between the battery and the rear surface cover, and configured to charge the battery, wherein the antenna structure comprises:

an insulating substrate;

a shielding sheet comprising a first magnetic material;

a coil disposed on the insulating substrate in a winding structure, the coil being wound multiple times in a clockwise or a counterclockwise direction around an axis normal to the insulating substrate, and comprising a coil upper layer part disposed on a first surface of the insulating substrate, the first surface facing the rear surface cover, and a coil lower layer part disposed on a second surface of the insulating substrate;

a coating layer comprising a second magnetic material and disposed adjacent to and surrounding the coil upper layer part in a winding structure corresponding to the winding structure of the coil;

a spacer configured to space the shielding sheet apart from the coil by a critical distance or more to reduce a magnetic flux generated in the coil and leaked to the coating layer through the shielding sheet; and an adhesive layer between the insulating substrate and the spacer.

17. The portable electronic device of claim 16, wherein the insulating substrate, the coil, and the coating layer are disposed on a flexible printed circuit board (FPCB).

18. The portable electronic device of claim 16, wherein the first magnetic material included in the coating layer comprises iron or nickel, and wherein the second magnetic material included in the shielding sheet comprises a nanocrystal.

* * * * *